United States Patent
Negley et al.

(10) Patent No.: US 8,008,676 B2
(45) Date of Patent: Aug. 30, 2011

(54) SOLID STATE LIGHT EMITTING DEVICE AND METHOD OF MAKING SAME

(75) Inventors: Gerald H. Negley, Durham, NC (US); F. Neal Hunter, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/753,103

(22) Filed: May 24, 2007

(65) Prior Publication Data

US 2007/0280624 A1    Dec. 6, 2007

Related U.S. Application Data

(60) Provisional application No. 60/808,925, filed on May 26, 2006.

(51) Int. Cl.
*H01L 33/00* (2010.01)

(52) U.S. Cl. ............ 257/98; 257/99; 257/100; 257/103; 257/E33.067; 257/E33.072

(58) Field of Classification Search ............... 257/98, 257/99, 100, 103, E33.067, E33.072
See application file for complete search history.

(56) References Cited

U.S. PATENT DOCUMENTS

| | | | |
|---|---|---|---|
| 3,547,214 A | 12/1970 | Ravenel |
| 3,875,456 A | 4/1975 | Kano et al. |
| 3,927,290 A | 12/1975 | Denley |
| 4,152,044 A | 5/1979 | Liu |
| 4,329,625 A | 5/1982 | Nishizawa et al. |
| 4,346,275 A | 8/1982 | Ieakiri et al. |
| 4,427,213 A | 1/1984 | Raidel, Jr. |
| 4,476,620 A | 10/1984 | Ohki et al. |
| 4,566,719 A | 1/1986 | Van Denberg |
| 4,568,140 A | 2/1986 | Van der Werf et al. |
| 4,583,822 A | 4/1986 | Southwell |
| 4,865,685 A | 9/1989 | Palmour |
| 4,890,150 A | 12/1989 | Vera et al. |
| 4,902,356 A | 2/1990 | Noguchi et al. |
| 4,912,532 A | 3/1990 | Cook et al. |
| 4,918,497 A | 4/1990 | Edmond |

(Continued)

FOREIGN PATENT DOCUMENTS

EP    0 519 690    12/1992

(Continued)

OTHER PUBLICATIONS

U.S. Appl. No. 11/613,692, filed Dec. 20, 2006.

(Continued)

*Primary Examiner* — Minh-Loan T Tran
(74) *Attorney, Agent, or Firm* — Burr & Brown

(57) ABSTRACT

There is provided a solid state light emitting device comprising at least one light emitting active layer structure and at least one structure selected from among: (1) a first element having at least a first region which has an index of refraction gradient, (2) a first element, at least a portion of which has an index of refraction which is lower than an index of refraction of a side of the active layer, (3) first and second elements, in which one side of the second element is positioned on a side of the active layer and the first element is positioned on the other side of the second element, and in which at least a portion of the first element has an index of refraction which is lower than the index of refraction of at least a portion of the second element. Also provided are methods of making such devices.

93 Claims, 3 Drawing Sheets

U.S. PATENT DOCUMENTS

| | | |
|---|---|---|
| 4,934,788 A | 6/1990 | Southwell |
| 4,946,547 A | 8/1990 | Palmour et al. |
| 4,966,862 A | 10/1990 | Edmond |
| 4,981,551 A | 1/1991 | Palmour |
| 5,002,305 A | 3/1991 | Raidel |
| 5,027,168 A | 6/1991 | Edmond |
| 5,037,126 A | 8/1991 | Gottschalk et al. |
| 5,087,949 A | 2/1992 | Haitz et al. |
| 5,100,233 A | 3/1992 | Southwell |
| 5,103,271 A | 4/1992 | Izumiya et al. |
| 5,127,668 A | 7/1992 | Raidel |
| 5,200,022 A | 4/1993 | Kong et al. |
| 5,210,051 A | 5/1993 | Carter, Jr. et al. |
| 5,225,244 A | 7/1993 | Aharoni et al. |
| 5,264,997 A | 11/1993 | Hutchisson et al. |
| 5,338,944 A | 8/1994 | Edmond et al. |
| 5,376,241 A | 12/1994 | Shor et al. |
| 5,376,580 A | 12/1994 | Kish et al. |
| RE34,861 E | 2/1995 | Davis et al. |
| 5,393,993 A | 2/1995 | Edmond et al. |
| 5,416,342 A | 5/1995 | Edmond et al. |
| 5,502,316 A | 3/1996 | Kish et al. |
| 5,523,589 A | 6/1996 | Edmond et al. |
| 5,536,974 A | 7/1996 | Nishiguchi |
| 5,604,135 A | 2/1997 | Edmond et al. |
| 5,631,190 A | 5/1997 | Negley |
| 5,644,156 A | 7/1997 | Suzuki et al. |
| 5,698,352 A | 12/1997 | Ogawa |
| 5,739,554 A | 4/1998 | Edmond et al. |
| 5,767,581 A | 6/1998 | Nakamura et al. |
| 5,783,909 A | 7/1998 | Hochstein |
| 5,880,510 A | 3/1999 | Cockrum et al. |
| 5,909,303 A | 6/1999 | Trezza et al. |
| 5,912,477 A | 6/1999 | Negley |
| 5,939,732 A | 8/1999 | Kurtz et al. |
| 5,959,316 A | 9/1999 | Lowery |
| 5,985,687 A | 11/1999 | Bowers et al. |
| 6,051,876 A | 4/2000 | Gardner et al. |
| 6,071,795 A | 6/2000 | Cheung et al. |
| 6,078,148 A | 6/2000 | Hochstein |
| 6,095,666 A | 8/2000 | Salam |
| 6,120,600 A | 9/2000 | Edmond et al. |
| 6,127,784 A | 10/2000 | Grossman et al. |
| 6,153,985 A | 11/2000 | Grossman |
| 6,171,978 B1 | 1/2001 | Lin et al. |
| 6,177,688 B1 | 1/2001 | Linthicum et al. |
| 6,187,606 B1 | 2/2001 | Edmond et al. |
| 6,201,262 B1 | 3/2001 | Edmond et al. |
| 6,225,647 B1 | 5/2001 | Kurtz et al. |
| 6,236,331 B1 | 5/2001 | Dussureault |
| 6,258,699 B1 | 7/2001 | Chang et al. |
| 6,274,924 B1 | 8/2001 | Carey et al. |
| 6,285,139 B1 | 9/2001 | Ghanem |
| 6,292,901 B1 | 9/2001 | Lys et al. |
| 6,303,405 B1 | 10/2001 | Yoshida et al. |
| 6,335,538 B1 | 1/2002 | Prutchi et al. |
| 6,350,041 B1 | 2/2002 | Tarsa et al. |
| 6,357,889 B1 | 3/2002 | Duggal et al. |
| 6,362,578 B1 | 3/2002 | Swanson et al. |
| 6,365,429 B1 | 4/2002 | Kneissl et al. |
| 6,410,942 B1 | 6/2002 | Thibeault et al. |
| 6,411,046 B1 | 6/2002 | Muthu |
| 6,420,199 B1 | 7/2002 | Coman et al. |
| 6,420,242 B1 | 7/2002 | Cheung et al. |
| 6,429,460 B1 | 8/2002 | Chen et al. |
| 6,441,558 B1 | 8/2002 | Muthu et al. |
| 6,448,102 B1 | 9/2002 | Kneissl et al. |
| 6,455,876 B1 | 9/2002 | Kikawa et al. |
| 6,465,809 B1 | 10/2002 | Furukawa et al. |
| 6,468,824 B2 | 10/2002 | Chen et al. |
| 6,489,637 B1 | 12/2002 | Sakamoto et al. |
| 6,495,964 B1 | 12/2002 | Muthu et al. |
| 6,498,440 B2 | 12/2002 | Stam et al. |
| 6,510,995 B2 | 1/2003 | Muthu et al. |
| 6,521,916 B2 | 2/2003 | Roberts et al. |
| 6,559,075 B1 | 5/2003 | Kelly et al. |
| 6,562,648 B1 | 5/2003 | Wong et al. |
| 6,563,141 B1 | 5/2003 | Dawson et al. |
| 6,576,881 B2 | 6/2003 | Muthu et al. |
| 6,576,930 B2 | 6/2003 | Reeh et al. |
| 6,607,931 B2 | 8/2003 | Streubel |
| 6,610,563 B1 | 8/2003 | Waitl et al. |
| 6,624,350 B2 | 9/2003 | Nixon et al. |
| 6,630,801 B2 | 10/2003 | Schuurmans |
| 6,657,236 B1 | 12/2003 | Thibeault et al. |
| 6,674,060 B2 | 1/2004 | Antila |
| 6,677,173 B2 | 1/2004 | Ota |
| 6,716,654 B2 | 4/2004 | Hsu et al. |
| 6,737,801 B2 | 5/2004 | Ragle |
| 6,740,604 B2 | 5/2004 | Kelly et al. |
| 6,741,351 B2 | 5/2004 | Marshall et al. |
| 6,746,889 B1 | 6/2004 | Eliashevich et al. |
| 6,757,314 B2 | 6/2004 | Kneissl et al. |
| 6,784,463 B2 | 8/2004 | Camras et al. |
| 6,786,390 B2 | 9/2004 | Yang et al. |
| 6,800,500 B2 | 10/2004 | Coman et al. |
| 6,806,112 B1 | 10/2004 | Horng et al. |
| 6,809,341 B2 | 10/2004 | Hsu et al. |
| 6,809,347 B2 | 10/2004 | Tasch et al. |
| 6,836,081 B2 | 12/2004 | Swanson et al. |
| 6,841,804 B1 | 1/2005 | Chen et al. |
| 6,841,947 B2 | 1/2005 | Berg-johansen |
| 6,846,686 B2 | 1/2005 | Saeki et al. |
| 6,849,878 B2 | 2/2005 | Bader et al. |
| 6,884,647 B2 | 4/2005 | Sakai et al. |
| 6,891,871 B1 | 5/2005 | Nomura et al. |
| 6,900,473 B2 | 5/2005 | Yoshitake et al. |
| 6,900,474 B2 | 5/2005 | Misra et al. |
| 6,936,857 B2 | 8/2005 | Doxsee et al. |
| 6,949,401 B2 | 9/2005 | Kaminski et al. |
| 6,972,438 B2 | 12/2005 | Li et al. |
| 7,009,343 B2 | 3/2006 | Lim et al. |
| 7,023,543 B2 | 4/2006 | Cunningham |
| 7,084,435 B2 | 8/2006 | Sugimoto et al. |
| 7,087,936 B2 | 8/2006 | Negley |
| 7,093,958 B2 | 8/2006 | Coushaine |
| 7,102,152 B2 | 9/2006 | Chau et al. |
| 7,135,664 B2 | 11/2006 | Vornsand et al. |
| 7,140,752 B2 | 11/2006 | Ashdown |
| 7,173,384 B2 | 2/2007 | Plotz et al. |
| 7,186,000 B2 | 3/2007 | Lebens et al. |
| 7,202,608 B2 | 4/2007 | Robinson et al. |
| 7,208,713 B2 | 4/2007 | Ishiguchi |
| 7,213,940 B1 | 5/2007 | Van De Ven et al. |
| 7,256,557 B2 | 8/2007 | Lim et al. |
| 7,365,371 B2 | 4/2008 | Andrews et al. |
| 7,427,806 B2 | 9/2008 | Arndt et al. |
| 2001/0031811 A1 | 10/2001 | Li et al. |
| 2002/0015013 A1 | 2/2002 | Ragle |
| 2002/0121642 A1 | 9/2002 | Doverspike et al. |
| 2002/0123164 A1 | 9/2002 | Slater, Jr. et al. |
| 2002/0139990 A1 | 10/2002 | Suehiro et al. |
| 2002/0140879 A1 | 10/2002 | Fujieda |
| 2002/0153835 A1 | 10/2002 | Fujiwara et al. |
| 2002/0163302 A1 | 11/2002 | Nitta et al. |
| 2002/0190972 A1 | 12/2002 | Van De Ven |
| 2003/0006418 A1 | 1/2003 | Emerson et al. |
| 2003/0089918 A1 | 5/2003 | Hiller et al. |
| 2003/0117798 A1 | 6/2003 | Leysath |
| 2003/0141510 A1 | 7/2003 | Brunner et al. |
| 2003/0173602 A1 | 9/2003 | Hsu et al. |
| 2003/0218798 A1 | 11/2003 | Kanazawa |
| 2004/0056260 A1 | 3/2004 | Slater, Jr. et al. |
| 2004/0061120 A1 | 4/2004 | Mizuyoshi |
| 2004/0070004 A1 | 4/2004 | Eliashevich et al. |
| 2004/0072382 A1 | 4/2004 | Kelly et al. |
| 2004/0094774 A1 | 5/2004 | Steigerwald et al. |
| 2004/0188697 A1 | 9/2004 | Brunner et al. |
| 2004/0207313 A1 | 10/2004 | Omoto et al. |
| 2004/0212998 A1 | 10/2004 | Mohacsi |
| 2005/0077535 A1 | 4/2005 | Li |
| 2005/0082562 A1 | 4/2005 | Ou et al. |
| 2005/0099478 A1 | 5/2005 | Iwase |
| 2005/0117320 A1 | 6/2005 | Leu et al. |
| 2005/0152127 A1 | 7/2005 | Kamiya et al. |
| 2005/0218421 A1 | 10/2005 | Andrews et al. |
| 2005/0224829 A1 | 10/2005 | Negley et al. |

| | | |
|---|---|---|
| 2005/0227379 A1 | 10/2005 | Donofrio |
| 2005/0274972 A1 | 12/2005 | Roth et al. |
| 2006/0006404 A1 | 1/2006 | Ibbetson et al. |
| 2006/0034082 A1 | 2/2006 | Park et al. |
| 2006/0081862 A1 | 4/2006 | Chua et al. |
| 2006/0105482 A1 | 5/2006 | Alferink |
| 2006/0220046 A1 | 10/2006 | Yu et al. |
| 2007/0048953 A1 | 3/2007 | Gealy et al. |
| 2007/0090383 A1 | 4/2007 | Ota et al. |
| 2007/0139923 A1 | 6/2007 | Negley et al. |
| 2007/0170447 A1 | 7/2007 | Negley et al. |
| 2007/0236911 A1 | 10/2007 | Negley |
| 2007/0247414 A1 | 10/2007 | Roberts |
| 2007/0263393 A1 | 11/2007 | Van De Ven |
| 2007/0274063 A1 | 11/2007 | Negley |
| 2007/0278512 A1 | 12/2007 | Loh et al. |
| 2007/0280624 A1 | 12/2007 | Negley et al. |
| 2008/0036364 A1 | 2/2008 | Li et al. |
| 2008/0074032 A1 | 3/2008 | Yano et al. |

FOREIGN PATENT DOCUMENTS

| | | |
|---|---|---|
| EP | 0 684 648 | 11/1995 |
| EP | 0 936 682 | 8/1999 |
| EP | 1 059 667 | 12/2000 |
| EP | 1 081 771 | 3/2001 |
| EP | 1 111 966 | 6/2001 |
| EP | 1 156 020 | 11/2001 |
| EP | 1 198 016 | 4/2002 |
| EP | 1 246 266 | 10/2002 |
| EP | 1 263 058 | 12/2002 |
| EP | 1 345 275 | 9/2003 |
| GB | 1136218 | 12/1968 |
| JP | 61-059886 | 3/1986 |
| JP | 07-007179 | 10/1995 |
| JP | 08-032120 | 2/1996 |
| JP | 09-027643 | 1/1997 |
| JP | 11-238913 | 8/1999 |
| KR | 10-0580753 | 5/2006 |
| WO | 98/43014 | 10/1998 |
| WO | 98/56043 | 12/1998 |
| WO | 00/34709 | 6/2000 |
| WO | 01/15242 | 3/2001 |
| WO | 02/068227 | 9/2002 |
| WO | 03/005458 | 1/2003 |
| WO | 03/010832 | 2/2003 |
| WO | 03/069685 | 8/2003 |
| WO | 2004/068594 | 8/2004 |
| WO | 2005/098975 | 10/2005 |
| WO | 2005/104247 | 11/2005 |
| WO | 2006/064996 | 6/2006 |
| WO | 2007/061758 | 5/2007 |

OTHER PUBLICATIONS

U.S. Appl. No. 11/614,180, filed Dec. 21, 2006.
U.S. Appl. No. 11/624,811, filed Jan. 19, 2007.
U.S. Appl. No. 11/743,754, filed May 3, 2007.
U.S. Appl. No. 11/751,990, filed May 22, 2007.
U.S. Appl. No. 12/002,429, filed Dec. 14, 2007.
U.S. Appl. No. 11/895,573, filed Aug. 24, 2007.
U.S. Appl. No. 11/818,818, filed Jun. 14, 2007.
U.S. Appl. No. 11/443,741, filed May 31, 2006.
U.S. Appl. No. 11/685,761, filed Mar. 13, 2007.
"Information about Dow Corning® Brand LED Materials: Silicones and Electronics," Dow Corning Corportion, 2005.
Narendran et al., "Solid State lighting: failure analysis of white LEDs," Journal of Cystal Growth, vol. 268, Issues 1-4, Aug. 2004, Abstract.
Perduijn et al., *Light Output Feedback Solution for RGB LED Backlight Applications*, SID Digest (2000).
Zhu et al., *Optimizing the Performance of Remote Phosphor LED*, First International Conference on White LED's and Solid State Lighting, PW-48 (Nov. 26-30, 2007).
Kim, J. K. et al., "Strongly Enhanced Phosphor Efficiency in GaInN White Light-Emitting Diodes Using Remote Phosphor Configuration and Diffuse Reflector Cup," Japanese Journal of Applied Physics, Japan Socient of applied Physics, Tokyo, JP, vol. 44, No. 20-23, XP-001236966, Jan. 1, 2005.
Nichia, White LED, Part Nos. NSPW300BS, "Specifications for Nichia White LED, Model NSPW300BS," Nichia Corporation, Jan. 12, 2004.
Nichia, White LED, Part Nos. NSPW312BS, "Specifications for Nichia White LED, Model NSPW312BS," Nichia Corporation, Jan. 14, 2004.
Sakai et al., *Experimental Investigation of Dependence of Electrical Characteristics on Device Parameters in Trench Mos BarrierShottky Diodes*, Proceedings of 1998 International Symposium on Power Semiconductor Devices & ICs, Kyoto, pp. 293-296, Jun. 1998.
Zhang Ap et al., *Comparison of GAN P-I-N and Schottky Rectifier Performance*, IEEE Transactions on Electron Devices, IEEE Inc., New York, US, Vo. 48, No. 3, pp. 407-411, Mar. 2001.
American Handbook of Physics Handbook, 3rd Edition, McGraw-Haill, Ed: Dwight E. Gray, 1972.
Kasugai et al., *Moth-Eye Light-Emitting Diodes*, Mater Res. Soc. Symp. Proc. vol. 831, 2005, Material Research Society, pp. E1.9.1-E1.9.6.
Kelner, G., et al., *Plasma Etching of BETA-SiC*, Journal of the Electrochemical Society, Manchester, New Hampshire, U.S. vol. 134, No. 1, Jan. 1987, pp. 253-254.
Khan, F.A., et al., *High Rate Etching of SiC Using Inductively Coupled Plasma Reactive Ion Etching in SF6-Based Gas Mixtures*, Applied Physics Letters, AIP, American Institute of Physics, Melville, NY, US, vol. 75, No. 15, Oct. 11, 1999, pp. 2268-2270.
Lagoubi et al., *Conditioning of N-Silicon by Photoelectrochimical Etching for Photovoltaic Application*, Proc. of the 11th E.C. Photovoltaic Solar Energy Conference, Oct. 12, 1992-Oct. 16, 1992, pp. 250-253, XP008043956, pp. 252-253, Fig. 8.
Lin et al., *Design and Fabrication of Omnidirectional Reflectors in the Visible Range*, Journal of Modern Otpics, vol. 52, No. 8, May 2005, pp. 1155-1160.
Mimura et al., *Blue Electroluminescence from Pourous Silicon Carbide*, Appl. Phys. Lett 65(26), Dec. 26, 1994, pp. 3350-3352.
Palmour, J.W., et al., *Crystallographic Etching Phenomenon during Plasma Etching of SiC (100) Thin Films in SF6*, Journal of the Electrochemical Society, Electrochemical Society, Manchester, N Hampshire, U.S., vol. 136, No. 2, Feb. 1, 1989, pp. 491-495.
Perrin et al., *Left-Handed Electromagnetism obtained via Nanostructured Metamaterials: Comparison with that from Microstructured Photonic Cyrstals*, Journal of Opics A: Pure and Applied Optics 7 (2005), S3-S11.
Schnitzer, et al., *30% External Quantum Efficieny from Surface Textured, Thin-Film Light-Emitting Diodes*, Applied Physics Lett. 63(16), Oct. 18, 1993, pp. 2174-2176.
Shor, et al., *Direct Observation of Porous SiC formed by Anodization in HF*, Appl. Phys. Lett. 62(22), May 31, 1993, pp. 2836-2838.
Streubel et al., *High Brightness AlGaInP Light-Emitting Diodes*, IEEE Journal on Selected Topis in Quantum Electronics, Vo. 8, Now. 2, Mar./Apr. 2002, pp. 321-332.
Windisch et al., *Non-Resonant Cavity Light-Emitting Diodes, In Light Emitting Diodes: Research Manufacturing, and Applications* 1V, H. Walter Yao et al., Proceding of SPIE vol. 3938 (2000), pp. 70-76.
Windisch, R., et al., "40% Efficient Thin-Film Surface-Textured Light-Emitting Diodes by Optimization of Natural Lithography," IEEE Transactions on Electron Devices, ISSN: 0018-9383, vol. 47 No. 7, Jul. 2000, pp. 1492-1498.
Windisch, R., et al., *Impact of Texture-Enhanced Transmission of High-Efficiency Surface-Textured Light-Emitting Diodes, Applied Physics Letters*, vol. 79, No. 15, Oct. 8, 2001, pp. 2315-2317.
Windisch, R., et al., *Light Extraction Mechanisms in High-Efficiency Surface-Textured Light-Emitting Diodes*, IEEE Journal on Selected Topics in Quantum Electronics, vol. 8, No. 2, Mar./Apr. 2002, pp. 248-255.
Zangooie et al., *Surface, Pore Morphology, and Optical Properties of Porous 4H-SiC*, Journal of the Electrochemical Society, 148(6) G297-G302 (2001), Jan. 9, 2001.

SOLID STATE LIGHT EMITTING DEVICE AND METHOD OF MAKING SAME

CROSS-REFERENCE TO RELATED APPLICATIONS

This application claims the benefit of U.S. Provisional Patent Application No. 60/808,925, filed May 26, 2006, the entirety of which is incorporated herein by reference.

FIELD OF THE INVENTION

The present invention relates to a solid state light emitting device. More particularly, the present invention relates to a solid state light emitting device with improved light extraction efficiency. The present invention also relates to a method of making such solid state light emitting devices.

BACKGROUND OF THE INVENTION

A large proportion (some estimates are as high as twenty-five percent) of the electricity generated in the United States each year goes to lighting. Accordingly, there is an ongoing need to provide lighting which is more energy-efficient. It is well-known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient as compared to solid state light emitters, such as light emitting diodes.

In addition, as compared to the normal lifetimes of solid state light emitters, e.g., light emitting diodes, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction.

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters can be used in place of incandescent lights, fluorescent lights and other light-generating devices in a wide variety of applications. In addition, where light emitting diodes (or other solid state light emitters) are already being used, efforts are ongoing to provide light emitting diodes (or other solid state light emitters) which are improved, e.g., with respect to energy efficiency, color rendering index (CRI Ra), contrast, efficacy (lm/W), and/or duration of service.

A variety of solid state light emitters are well-known. For example, one type of solid state light emitter is a light emitting diode.

Light emitting diodes are semiconductor devices that convert electrical current into light. A wide variety of light emitting diodes are used in increasingly diverse fields for an ever-expanding range of purposes.

More specifically, light emitting diodes are semiconducting devices that emit light (ultraviolet, visible, or infrared) when a potential difference is applied across a p-n junction structure. There are a number of well-known ways to make light emitting diodes and many associated structures, and the present invention can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode.

As is well-known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

Although the development of light emitting diodes has in many ways revolutionized the lighting industry, some of the characteristics of light emitting diodes have presented challenges, some of which have not yet been fully met. For example, the emission spectrum of any particular light emitting diode is typically concentrated around a single wavelength (as dictated by the light emitting diode's composition and structure), which is desirable for some applications, but not desirable for others, (e.g., for providing lighting, such an emission spectrum provides a very low CRI Ra).

Because light that is perceived as white is necessarily a blend of light of two or more colors (or wavelengths), no single light emitting diode has been developed that can produce white light. "White" LED lamps have been produced which have a light emitting diode pixel/cluster formed of respective red, green and blue light emitting diodes. Another "white" LED lamp which has been produced includes (1) a light emitting diode which generates blue light and (2) a luminescent material (e.g., a phosphor) that emits yellow light in response to excitation by light emitted by the light emitting diode, whereby the blue light and the yellow light, when mixed, produce light that is perceived as white light.

Light emitting diodes can thus be used individually or in any combinations, optionally together with one or more luminescent material (e.g., phosphors or scintillators) and/or filters, to generate light of any desired perceived color (including white). Accordingly, the areas in which efforts are being made to replace existing light sources with light emitting diode light sources, e.g., to improve energy efficiency, color rendering index (CRI Ra), efficacy (lm/W), and/or duration of service, are not limited to any particular color or color blends of light.

A wide variety of luminescent materials (also known as lumiphors or luminophoric media, e.g., as disclosed in U.S. Pat. No. 6,600,175, the entirety of which is hereby incorporated by reference) are well-known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished by adding the luminescent materials to a clear or substantially transparent encapsulant material (e.g., epoxy-based, silicone-based, glass-based or metal oxide-based material) as discussed above, for example by a blending or coating process.

As noted above, "white LED lamps" (i.e., lamps which are perceived as being white or near-white) have been investigated as potential replacements for white incandescent lamps. A representative example of a white LED lamp includes a package of a blue light emitting diode chip, made of indium gallium nitride (InGaN) or gallium nitride (GaN), coated with a phosphor such as YAG. In such an LED lamp, the blue light emitting diode chip produces an emission with a wavelength of about 450 nm, and the phosphor produces yellow fluorescence with a peak wavelength of about 550 nm on receiving that emission. For instance, in some designs, white light emitting diode lamps are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor, which becomes excited and emits a yellow ray. The part of the blue light emitted by the light emitting diode which is transmitted through the phosphor is mixed with the yellow light emitted by the phosphor. The viewer perceives the mixture of blue and yellow light as white light.

Another type uses a blue or violet light emitting diode chip which is combined with phosphor materials that produce red or orange and green or yellowish-green light rays. In such a lamp, part of the blue or violet light emitted by the light emitting diode chip excites the phosphors, causing the phosphors to emit red or orange and yellow or green light rays. These rays, combined with the blue or violet rays, can produce the perception of white light.

As also noted above, in another type of LED lamp, a light emitting diode chip that emits an ultraviolet ray is combined with phosphor materials that produce red (R), green (G) and blue (B) light rays. In such an LED lamp, the ultraviolet ray that has been radiated from the light emitting diode chip excites the phosphor, causing the phosphor to emit red, green and blue light rays which, when mixed, are perceived by the human eye as white light. Consequently, white light can also be obtained as a mixture of these light rays.

In the case of conventional LED packages which include a phosphor, a significant proportion (e.g., in many cases, as much as 20% to 25%) of the excitation light (i.e., light from the LED) is reflected (back scattered) from the phosphor back into the light emitting diode chip/package. Back scattered light which is scattered back into the light emitting diode chip itself has a very low probability of coming out of the chip, and hence, such back scattering results in a system loss of energy.

In addition, the phosphor converted light is omni-directional, so that in general, 50% of the light is directed back to the LED source.

There is an ongoing need for ways to use light emitting diodes in a wider variety of applications, with greater energy efficiency, low cost and with improved efficacy (lm/W).

BRIEF SUMMARY OF THE INVENTION

In a first aspect, the present invention is directed to a solid state light emitting device comprising a first element and at least one light emitting active layer structure, in which the first element is positioned on the light emitting active layer structure. In this aspect of the present invention, the first element has at least a first region which has an index of refraction gradient.

The expression "index of refraction gradient", as used herein in connection with a structure (e.g., a layer, a laminate of layers bonded together or a stack of layers), means that the structure has a first side and a second side, a first region including the first side having a first index of refraction, a second region including the second side having a second index of refraction, the first index of refraction being different from the second index of refraction.

In some embodiments according to this aspect of the present invention, the first element has at least a first region which has a "stepped index of refraction gradient". The expression "stepped index of refraction gradient", as used herein in connection with a structure, means that the structure has at least a first region, a second region, a third region and a fourth region, and that if light is emitted by the light emitting active layer structure and the light passes through the structure, such light would pass through the first region, then the second region, then the third region and then the fourth region in succession, the first region having a first index of refraction, the second region having a second index of refraction, the third region having a third index of refraction, the fourth region having a fourth index of refraction, the first index of refraction being larger than the second index of refraction, the second index of refraction being larger than the third index of refraction, and the third index of refraction being larger than the fourth index of refraction.

In some embodiments according to this aspect of the present invention, the first element has at least a first region which has a "substantially continuous index of refraction gradient". The expression "substantially continuous index of refraction gradient", as used herein in connection with a structure, means that the structure has at least ten regions, and that if light is emitted by the light emitting active layer structure and the light passes through the structure, the light would pass through each of the ten regions in succession, each successive layer having a lower index of refraction. In some embodiments according to this aspect of the present invention, the graded index of refraction is a continuous monotonically changing function between the respective surfaces.

In accordance with the present invention, it has been found that by providing a first element which has at least a first region which has an index of refraction gradient (in some cases, a stepped index of refraction gradient, and in some cases a substantially continuous index of refraction gradient), better light extraction efficiency from the light emitting active layer structure can be obtained.

While not being bound by any theory, it is believed that the reason the first aspect of the present invention (as well as the other aspects of the present invention, described below) achieves improved light extraction efficiency is by reducing the amount of light that is reflected at one or more interfaces where there would otherwise be a larger drop in index of refraction. That is, the present invention seeks to minimize the magnitude of drops in index of refraction as light emitted from the light emitting active layer structure passes from one region to another by making such drops more gradual. In many aspects of the present invention, as described herein, one or more elements are added to structures which would function as light emitting devices without such added structures, where the added structures are provided to minimize the magnitude of drops in index of refraction which would otherwise occur.

The expression "on", as used herein, to indicate that a first structure is "on" a second structure, means that the first structure and the second structure are both contained in the same overall structure, and are not necessarily in contact with each other. For example, in the expression "the first element is positioned on the light emitting active layer structure" set forth above, the first element and the light emitting active layer structure are both contained in the same overall structure, and are not necessarily in contact with each other. That is, there may be one or more intervening structures between the first element and the light emitting active layer structure, and each adjoining structure is in direct contact with its immediate neighbor (or neighbors where it has neighbors on both sides). As used herein, a statement that a first structure is "on" a second structure is interchangeable with a statement that the second structure is "on" the first structure (i.e., the order in which the structures are recited in such a statement does not imply anything other than that the structures are contained in the same overall structure.

One representative example of an intervening structure which is positioned between first and second elements (i.e., where the first element is "on" the second element) is a structure comprising a material which has an index of refraction which is similar to the index of refraction of at least one surface of the first element or the index of refraction of at least one surface of the second element. For example, one such intervening structure is a layer of adhesive (having a thickness of more than 1 micrometer) which has an index of refraction which is similar to the index of refraction of a surface of the first element with which the layer of adhesive is in direct contact. The expression "similar index of refraction" as used herein, e.g., in a statement that the index of refraction (n1) of a first structure is "similar to" the index of refraction (n2) of a second structure means that the total reflection as defined by $R=((n1-n2)/(n1+n2))^2$ is less than 0.01.

The expression "direct contact" (or "in direct contact with"), as used herein, to indicate that a first structure and a second structure are in "direct contact" means that the first structure is on the second structure (and therefore also the second structure is on the first structure) and that there is substantially nothing between the first structure and the second structure. The expression "substantially nothing" means that there is nothing between the first structure and the second structure, or any material (e.g., glue) between the first structure and the second structure has a thickness which is equal to or less than 1 micrometer, preferably less than one quarter of the wavelength of any visible light.

In some embodiments according to this aspect of the present invention, the device further comprises a second element which is positioned on an opposite side of the light emitting active layer structure relative to the first element, i.e., the light emitting active layer structure has an active layer structure first side and an active layer structure second side, the first element is positioned on the active layer first side, and the active layer second side is positioned on the second element.

In some embodiments according to this aspect of the present invention, the device further comprises at least one lumiphor, at least a portion of the lumiphor being positioned opposite the first element relative to the light emitting active layer structure, whereby if light is emitted from the light emitting active layer structure and passes through the first element and the lumiphor, such light would pass through the first element before passing through the lumiphor.

In some embodiments according to this aspect of the present invention, the device further comprises at least one encapsulant region, at least a portion of the encapsulant region being positioned opposite the first element relative to the light emitting active layer structure, whereby if light is emitted from the light emitting active layer structure and passes through the first element and the encapsulant region, such light would pass through the first element before passing through the encapsulant region. In some such embodiments, the device further comprises at least one lumiphor, at least a portion of the lumiphor being positioned between the first element and the encapsulant region, whereby if light is emitted from the light emitting active layer structure and passes through the first element, the lumiphor and the encapsulant region, such light would pass through the first element before passing through the lumiphor and would pass through the lumiphor before passing through the encapsulant region.

In some embodiments according to this aspect of the present invention, the device further comprises a second element, wherein the second element is positioned on the light emitting active layer structure, and the first element is positioned on the second element.

In a second aspect, the present invention is directed to a solid state light emitting device comprising at least one light emitting active layer structure, a first element, a second element and at least one lumiphor. In this aspect of the present invention, the light emitting active layer structure has an active layer structure first side and an active layer structure second side, and a first region of the light emitting active layer structure, which includes the active layer structure first side, has an active layer first region index of refraction. The first element is positioned on the active layer structure first side and the second element is positioned on the active layer structure second side. At least a portion of the first element has a first element index of refraction which is lower than the active layer first region index of refraction. At least a portion of the lumiphor is positioned opposite the first element relative to the light emitting active layer structure, whereby if light is emitted from the light emitting active layer structure and passes through the first element and the lumiphor, such light would pass through the first element before passing through the lumiphor.

Consistent with as mentioned above, the use of the expression "on" in the preceding paragraph, means that the first element, the active layer structure and the second element are contained in the same overall structure, and the first element is not necessarily in direct contact with the active layer structure first side, and the second element is not necessarily in direct contact with the active layer structure second side.

In a third aspect, the present invention is directed to a solid state light emitting device comprising a solid state light emitting device comprising at least one light emitting active layer structure, a first element, a second element and at least one encapsulant region. In this aspect of the present invention, the light emitting active layer structure has an active layer structure first side and an active layer structure second side. A first region of the light emitting active layer structure, which includes the active layer structure first side, has an active layer first region index of refraction. The first element is positioned on the active layer structure first side, and the second element is positioned on the active layer structure second side. At least a portion of the first element has a first element index of refraction which is lower than the active layer first region index of refraction. At least a portion of the encapsulant region is positioned opposite the first element relative to the light emitting active layer structure, whereby if light is emitted from the light emitting active layer structure and passes through the first element and the encapsulant region, such light would pass through the first element before passing through the encapsulant region.

In a fourth aspect, the present invention is directed to a solid state light emitting device comprising a solid state light emitting device comprising at least one light emitting active layer structure, a first element and a second element. In this aspect of the present invention, the light emitting active layer structure has an active layer structure first side and an active layer structure second side. A first region of the light emitting active layer structure, which includes the active layer structure first side, has an active layer first region index of refraction. The first element has a first element first side and a first element second side. The first element second side is positioned on the active layer structure first side, and the second element is positioned on the active layer structure second side. An entirety of the first element first side is exposed. At least a portion of the first element has a first element index of refraction which is lower than the active layer first region index of refraction.

In a fifth aspect, the present invention is directed to a solid state light emitting device comprising a solid state light emitting device comprising at least one light emitting active layer structure, at least one reflective element, a first element and a second element. In this aspect of the present invention, the light emitting active layer structure has an active layer structure first side and an active layer structure second side, and a first region of the light emitting active layer structure which includes the active layer structure first side has an active layer first index of refraction. The reflective element has a reflective element first side and a reflective element second side. The reflective element first side is positioned on the active layer structure second side. The first element is positioned on the active layer structure first side, and the second element is positioned on the reflective element second side. At least a portion of the first element has a first element index of refraction which is lower than the active layer first index of refraction.

In a sixth aspect, the present invention is directed to a solid state light emitting device comprising a solid state light emitting device comprising at least one light emitting active layer structure, at least one reflective element, a first element and a second element. In this aspect of the present invention, the light emitting active layer structure has an active layer structure first side and an active layer structure second side. The second element has a second element first side and a second element second side. A first region of the light emitting active layer structure which includes the active layer structure first side has an active layer first index of refraction. The first element is positioned on the active layer structure first side, and the second element first side is positioned on the active layer structure second side. At least a portion of the first element has a first element index of refraction which is lower than the active layer first index of refraction. The reflective element is positioned on the second element second side.

In a seventh aspect, the present invention is directed to a solid state light emitting device comprising a solid state light emitting device comprising at least one light emitting active layer structure, a first element and a second element. In this aspect of the present invention, the light emitting active layer structure has an active layer structure first side and an active layer structure second side. At least a portion of the first element has a first element index of refraction. The second element has a second element first side and a second element second side, the second element second side being positioned on the active layer structure first side. A first region of the second element, which includes the second element first side, has a second element first index of refraction which is higher than the first element index of refraction. The first element is positioned on the second element first side.

In an eighth aspect, the present invention is directed to a method of making a solid state light emitting device comprising attaching a first element to at least one light emitting active layer structure, at least a first region of the first element having an index of refraction gradient.

In some embodiments according to this aspect of the present invention, the method further comprises depositing the light emitting active layer structure on a second element before attaching the first element to the light emitting active layer structure, such that the light emitting active layer structure has an active layer structure first side and an active layer structure second side, the first element is positioned on the active layer first side, and the active layer second side is positioned on the second element.

In a ninth aspect, the present invention is directed to a method of making a solid state light emitting device comprising (1) depositing a light emitting active layer structure on a second element, such that the light emitting active layer structure has an active layer structure first side and an active layer structure second side, (2) attaching a first element to the active layer structure first side, and (3) positioning at least one lumiphor such that at least a portion of the lumiphor is opposite the first element relative to the light emitting active layer structure, whereby if light is emitted from the light emitting active layer structure and passes through the first element and the lumiphor, such light would pass through the first element before passing through the lumiphor. In this aspect of the present invention, at least a portion of the first element has a first element index of refraction which is lower than an index of refraction of a first region of the active layer, which first region includes the active layer structure first side, and the active layer structure second side is on the second element.

In a tenth aspect, the present invention is directed to a method of making a solid state light emitting device comprising (1) depositing a light emitting active layer structure on a second element, such that the light emitting active layer structure has an active layer structure first side and an active layer structure second side, (2) attaching a first element to the active layer structure first side, and (3) positioning at least one encapsulant region such that at least a portion of the encapsulant region is opposite the first element relative to the light emitting active layer structure. In this aspect of the present invention, at least a portion of the first element has a first element index of refraction which is lower than an index of refraction of a first region of the active layer, which first region includes the active layer structure first side, and the active layer structure second side is on the second element.

In some embodiments according to the tenth aspect of the present invention, the method further comprises depositing the second element on at least one reflective element prior to depositing the light emitting active layer structure on the second element, such that the reflective element and the light emitting active layer structure are positioned on opposite sides of the second element.

In some embodiments according to the tenth aspect of the present invention, the method further comprises depositing at least one reflective element on the second element after depositing the light emitting active layer structure on the second element, such that the reflective element and the light emitting active layer structure are positioned on opposite sides of the second element.

In an eleventh aspect, the present invention is directed to a method of making a solid state light emitting device, comprising (1) depositing a reflective element on a second element, such that the reflective element has a reflective element first side and a reflective element second side, with the reflective element second side being on the second element (2) depositing a light emitting active layer structure on the reflective element first side, such that the light emitting active layer structure has an active layer structure first side and an active layer structure second side, with the active layer structure second side being on the reflective element first side, and (3) attaching a first element to the active layer structure first side. In this aspect of the present invention, at least a portion of the first element has a first element index of refraction which is lower than an index of refraction of a first region of the active layer, which first region includes the active layer structure first side.

In a twelfth aspect, the present invention is directed to a method of making a solid state light emitting device comprising (1) depositing a light emitting active layer structure on a second element, such that the light emitting active layer structure has an active layer structure first side and an active layer structure second side, with the active layer structure second side being on the second element (2) attaching a third element to the active layer structure first side, such that the third element has a third element first side and a third element second side, with the third element second side being on the active layer structure first side, (3) removing the second element, and (4) attaching a first element to the active layer structure second side. In this aspect of the present invention, at least a portion of the first element has a first element index of refraction which is lower than an index of refraction of a first region of the active layer structure, which first region includes the active layer structure second side.

In some embodiments according to the twelfth aspect of the present invention, the method further comprises depositing a reflective material onto the active layer structure first side prior to the attaching a third element to the active layer structure first side, such that the reflective material is positioned between the active layer structure first side and the third element.

In a thirteenth aspect, the present invention is directed to a method of making a solid state light emitting device comprising:

depositing a light emitting active layer structure on a first side of a second element, the second element comprising the first side and a second side, such that the light emitting active layer structure has an active layer structure first side and an active layer structure second side, a first region of the light emitting active layer structure which includes the active layer structure first side having an active layer first region index of refraction, the active layer structure first side being on the second element; and attaching a first element to the second side of the second element, at least a portion of the first element having a first element index of refraction, the first element index of refraction being lower than the active layer first region index of refraction.

The invention may be more fully understood with reference to the accompanying drawings and the following detailed description of the invention.

BRIEF DESCRIPTION OF THE DRAWING FIGURES

DETAILED DESCRIPTION OF THE INVENTION

Figure 1:
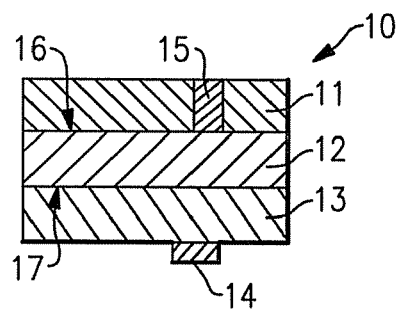
FIG. 1 is a schematic cross-sectional illustration of a first embodiment according to the present invention.

As noted above, the devices according to the present invention, comprise a first element and at least one light emitting active layer structure, and in various aspects and specific embodiments of the present invention, there can further be provided any additional desired structures, e.g., a second element, one or more lumiphors, one or more encapsulant regions, one or more reflective elements, and/or a third element.

Generally any suitable material can be used to form the first element, and persons of skill in the art are familiar with a variety of suitable materials. Preferably, the material in the first element is substantially transparent, i.e., if light emitted from the light emitting active layer structure is directed at the first element, at least 95% of the light across the spectrum of the output from the light emitting active layer structure would pass through the first element. For example, a wide variety of transparent materials can provide the necessary functions for the first element, such as high refractive index glasses, sapphire, a wide variety of crystals, glues, resins, epoxies, silicones, plastics, gels, liquids, air-gels, etc. A representative example of a suitable material is LAH80 glass material from Ohara Corporation, or ZnO with a refractive index of approximately 2.

The first element can generally be any suitable structure. Persons of skill in the art are readily familiar with a wide variety of such structures, and can readily obtain and/or construct such structures. Any such structures are suitable for use according to the present invention.

As noted above, in some aspects and embodiments of the present invention, the first element has an index of refraction gradient (as defined above), and in some embodiments of the present invention, the first element has a stepped index of refraction gradient (as defined above), and in some embodiments of the present invention, the first element has a substantially continuous index of refraction gradient (as defined above).

Persons of skill in the art can readily obtain or produce structures made of materials suitable for use as the first element which have an index of refraction gradient, a stepped index of refraction gradient and/or a substantially continuous index of refraction gradient, in order to provide a first element for use according to the present invention. For example, persons of skill in the art are familiar with methods of adding two or more glass formulations to each other in order to grade the refractive index. Alternatively or additionally, if desired, ion implantation could be used to provide the index of refraction gradient. Alternatively or additionally, if desired, nano materials including particles, rods or platelets, for example titanium dioxide nanoparticles, can be mixed or embedded in the material to increase, decrease the index of refraction or create a gradient of refractive index.

In some embodiments of the present invention, the first element has an index of refraction which is lower than the index of refraction of the first region (defined above) of the active layer structure or which is lower than the index of refraction of the first region of the second element. Persons of skill in the art are familiar with a wide variety of suitable materials which can be used for the first element, as well as for the active layer structure and for the second element, as discussed below, and can readily select suitable respective structures whereby the first element has an index of refraction which is lower than the index of refraction of the first region (defined above) of the active layer structure and/or lower than the index of refraction of the first region of the second element.

In some embodiments of the present invention, one or more luminescent material (e.g., YAG:Ce) can be dispersed (uniformly or non-uniformly) within the first element (in some cases, doing so can eliminate the need for a lumiphor).

In some embodiments of the present invention, a surface of the first element which is opposite a surface of the first element which is on the active layer structure includes optical features. Persons of skill in the art are familiar with LED packages which have a domed optical surface in order to reduce the effect of total internal reflection. By having a curved surface of the proper radius of curvature, the issue of "critical angle of total internal reflection (TIR)" can be reduced or eliminated. Included in the present invention is the consideration of shaping the exit side (the side exposed to air or the next media of lower index of refraction. Representative examples of such include a macroscopic array of hemispheres of a particular radius, the radius being determined by the endpoints (starting surface and terminating surface) of index of refraction. Or, these shapes could consist of a truly microscopic or nanoscopic array that replicates the "moth eye", such structures, and their manufacture, being familiar to, and readily practiced by, persons of skill in the art.

Owing to the fact that the first element is attached to a light emitting active layer structure (e.g., sapphire-based, or SiC-based, IV or etc. active layer) to improve light extraction, the "shaping" of the exit surface can be performed with methods that may not be directly compatible with the active layer structure, because the first element is attached to the wafer during a later stage of fabrication, i.e, the process windows are more open.

Persons of skill in the art are very familiar with methods for determining appropriate radii of curvature for optical features, depending on the respective indices of refraction of the respective materials on either side of the interface between (1) the first element and (2) the structure (e.g., air) with which it is in contact or the fluid (e.g., air) with which it interfaces.

Such optical features can assist in reducing the index of refraction drop between a surface of the first element which is in direct contact with an encapsulation region and such encapsulation region, or between a surface of the first element which is exposed to air and such air.

The light emitting active layer structure can generally be any suitable light emitting active layer structure, a wide variety of which are known by those of skill in the art and are readily available. Any such light emitting active layer structure are suitable for use according to the present invention.

Such light emitting active layer structures include inorganic and organic light emitters. Examples of types of such light emitters include a wide variety of light emitting diodes (inorganic or organic, including polymer light emitting diodes (PLEDs)), laser diodes, thin film electroluminescent devices, light emitting polymers (LEPs), which emit visible light, ultraviolet light and/or infrared light, a variety of each of which are well-known in the art (and therefore it is not necessary to describe in detail such devices, and/or the materials out of which such devices are made).

The second element (if employed) can generally be any suitable structure. For example, the second element can be any structure commonly referred to as a substrate. Persons of skill in the art are readily familiar with a wide variety of such structures, and can readily obtain and/or construct such structures. Any such structures are suitable for use according to the present invention. Representative examples of materials which can be used to make the second element are gallium phosphide, silicon carbide and silicon (all of which are semiconductors, but can be electrically conductive), and sapphire (which is electrically non-conductive).

As noted above, in some embodiments according to the present invention, there is provided one or more reflective elements. Such reflective elements, if employed, can be made of any of a wide variety of suitable reflective elements. For example, representative examples of suitable materials for making the reflective elements include aluminum and silver. There also exist some dielectric reflective elements—if such a reflective element is employed and is deposited directly on a structure which includes one or more contacts, the contacts can, if desired, be masked while depositing the dielectric reflective element or any dielectric material covering a contact can be removed in a later procedure.

The third element (if employed) can generally be any suitable structure. For example, the third element can be any structure commonly referred to as a substrate. Persons of skill in the art are readily familiar with a wide variety of such structures, and can readily obtain and/or construct such structures. Any such structures are suitable for use according to the present invention. Representative examples of materials which can be used to make the third element are germanium, silicon carbide and silicon.

Preferably, the devices according to the present invention include contacts through which power can readily be supplied to the light emitting active layer structure(s) to cause the light emitting active layer structure(s) to emit light. Persons of skill in the art are familiar with materials for use in forming contacts, as well as ways to provide such contacts, and any such materials and ways can be employed according to the present invention. Where a layer which is in contact with one side of a light emitting active layer structure is conductive (or where each member of a sequence of layers is conductive, with one of the layers in the sequence being in contact with the light emitting active layer structure), a contact can be provided on the conductive layer (or on any one of the conductive layers in the sequence of layers). Where one or more layer is not conductive (or not deemed to be sufficiently conductive), a one or more contacts can be provided which extends through such non-conductive layer (or insufficiently conductive layer), if necessary, and persons of skill in the art are readily familiar with ways to provide such contacts. Such contacts can be provided at any desired location and in any desired orientation, e.g., either or both contacts can be provided at (and/or extend to) the top and bottom of a laminate of layers which includes the light emitting active layer structure, either or both contacts can be provided (and/or extend) laterally from the light emitting active layer structure (i.e., in a direction parallel to a major surface of the light emitting active layer structure), or any other suitable location, orientation or shape, so long as current can be conducted to and from the light emitting active layer structure.

Any suitable structure can be provided for electrically connecting to the contacts, and/or for supporting the light emitting device of the present invention. For example, a variety of lead frame structures are well-known to those of skill in the art, and any of such structures may be made in any conventional configuration using any conventional techniques. Such a lead frame is preferably made of metal and may be stamped and optionally post-plated.

Some embodiments of the present invention comprise a first element, a light emitting active layer structure, a second element and at least two lumiphors, wherein the respective structures are arranged in succession: the first lumiphor, the second layer, the light emitting active layer structure, the first layer and the second lumiphor (with or without any additional layers positioned between any of these layers). Such embodiments can be used as omnidirectional light emitters, i.e., they can generate light and send the light in two opposite directions. In such embodiments, it is preferable that the second element have an index of refraction which is either a gradient or which has a value which is less than the index of refraction of the active layer structure and greater than the index of refraction of the first lumiphor (sapphire is a useful material for constructing such a second element).

As indicated above, the devices according to the present invention can comprise one or more lumiphors and/or one or more encapsulant regions. Accordingly, the present invention encompasses (but is not limited to):

(1) devices in which at least some of the light emitted by a light emitting active layer structure passes across an interface between the light emitting active layer structure and a first element, then through the first element, then across an interface between the first element and a lumiphor, then through the lumiphor, then across an interface between the lumiphor and an encapsulant region, then through the encapsulant region and then across an interface between the encapsulant region and the surrounding medium (e.g., air);

(2) devices in which at least some of the light emitted by a light emitting active layer structure passes across an interface between the light emitting active layer structure and a first element, then through the first element, then across an interface between the first element and an encapsulant region, then through the encapsulant region and then across an interface between the encapsulant region and the surrounding medium (e.g., air);

(3) devices in which at least some of the light emitted by a light emitting active layer structure passes across an interface between the light emitting active layer structure and a first element, then through the first element, then across an interface between the first element and a lumiphor, then through the lumiphor, then across an interface between the lumiphor and the surrounding medium (e.g., air); and (4) devices in which at least some of the light emitted by a light emitting active layer structure passes across an interface between the light emitting active layer structure and a first element, then through the first element, then across an interface between the first element and the surrounding medium (e.g., air).

A representative typical value for the index of refraction of a GaN or InGaN light emitting active layer structure is from about 2.2 to about 2.3, and that of AlInGaP, AlGaAs, GaP and GaAs is from about 3.2 to about 3.6.

A representative typical value for the index of refraction of a conventional lumiphor is about 1.8.

A representative typical value for the index of refraction of a conventional encapsulant region is from about 1.4 to about 1.55 (e.g., for an epoxy encapsulant).

The index of refraction of air is about 1.0.

The index of refraction of sapphire, a material which is sometimes used as a substrate for a light emitting device, is about 1.8.

The index of refraction of SiC, a material which is sometimes used as a substrate for a light emitting device, is about 2.6.

In accordance with the present invention, there is provided a first element (1) which has an index of refraction gradient (which can be a stepped index of refraction gradient, and/or which can be a substantially continuous index of refraction gradient), and/or (2) at least a portion of which having a first element index of refraction which is lower than the index of refraction of a first region of the active layer. By providing such a first element in a location as described herein, the amount of light internally reflected due to difference in the index of refraction between the structures which are on opposite sides of the first element is reduced as compared with what would be internally reflected if the first element were not positioned between such structures (e.g., instead of the index of refraction changing abruptly from 2.2 to 1.8 as light emitted from the light emitting active layer structure passes from an active layer structure to a lumiphor, the index of refraction drops more gradually as the light passes from the active layer structure into the first element, and then from the first element into the lumiphor. For example, in some embodiments of the present invention, the first element is positioned between and in direct contact with the active layer structure on one side and a lumiphor on the other side, and the first element has a substantially continuous index of refraction gradient ranging from the index of refraction for the active layer structure in the region thereof which includes a surface which is in direct contact with one side of the first element (in a region of the first element which includes the surface of the first element which is in direct contact with the active layer structure) to the index of refraction of a region of the lumiphor which includes a surface which is in direct contact with the other side of the first element (in a region of the first element which includes the surface of the first element which is in direct contact with the lumiphor), e.g., the index of refraction gradient can range from approximately equal to or greater than 2.2 to approximately equal to or less than 1.8. In some embodiments, the first element has an index of refraction which is substantially the geometric mean between the respective indices of refraction of the two materials between which it is positioned (and/or with which it is in contact on its opposite sides), and/or the first element has a refractive index between the respective indices of refraction of the two materials between which it is positioned (and/or with which it is in contact on its opposite sides), such as ZnO with a refractive index of approximately 2.0.

In other embodiments of the present invention, the first element is positioned between and in direct contact with the active layer structure on one side and an encapsulation region on the other side, and the first element has a substantially continuous index of refraction gradient ranging from the index of refraction for the active layer structure in the region thereof which includes a surface which is in direct contact with one side of the first element (in a region of the first element which includes the surface of the first element which is in direct contact with the active layer structure) to the index of refraction of a portion of the encapsulation region which includes a surface which is in direct contact with the other side of the first element (in a region of the first element which includes the surface of the first element which is in direct contact with the encapsulation region), e.g., the index of refraction gradient ranges from 2.2 to 1.4.

In other embodiments of the present invention, a first side of the first element is in direct contact with the active layer structure, and a second side of the first element is exposed to air. In some such embodiments, the first element includes an index of refraction gradient which decreases from the first side to the second side, whereby the index of refraction drop between the surface of the first element which is exposed to air and such air is less than the index of refraction drop would be if the active layer structure were exposed to air.

As noted above, in some embodiments according to the present invention, the lighting device further comprises at least one lumiphor (i.e., luminescence region or luminescent element which comprises at least one luminescent material).

The one or more lumiphors, when provided, can individually be any lumiphor, a wide variety of which are known to those skilled in the art. For example, the one or more luminescent materials in the lumiphor can be selected from among phosphors, scintillators, day glow tapes, inks which glow in the visible spectrum upon illumination with ultraviolet light, etc. The one or more luminescent materials can be down-converting or up-converting, or can include a combination of both types. For example, the first lumiphor can comprise one or more down-converting luminescent materials.

The or each of the one or more lumiphors can, if desired, further comprise (or consist essentially of, or consist of) one or more highly transmissive (e.g., transparent or substantially transparent, or somewhat diffuse) binder, e.g., made of epoxy, silicone, glass, metal oxide or any other suitable material (for example, in any given lumiphor comprising one or more binder, one or more phosphor can be dispersed within the one or more binder). For example, the thicker the lumiphor, in general, the lower the weight percentage of the phosphor can be. Representative examples of the weight percentage of phosphor include from about 3.3 weight percent up to about 20 weight percent, although, as indicated above, depending on the overall thickness of the lumiphor, the weight percentage of the phosphor could be generally any value, e.g., from 0.1 weight percent to 100 weight percent (e.g., a lumiphor formed by subjecting pure phosphor to a hot isostatic pressing procedure or electrophoretic deposition process).

Devices in which a lumiphor is provided can, if desired, further comprise one or more clear encapsulant (comprising, e.g., one or more silicone materials) positioned between the light emitting active layer structure (e.g., light emitting diode) and the lumiphor.

The, or each of the, one or more lumiphors can, independently, further comprise any of a number of well-known additives, e.g., diffusers, scatterers, tints, refractive index modifying nanoparticles, etc.

The, or each of the, one or more lumiphors can, independently, be positioned in any desired location, and can be held in place in any desired way, a wide variety of which will be readily apparent to persons of skill in the art, who will be readily able to position such lumiphor(s) in any such manner.

As noted above, some embodiments according to the present invention comprise one or more encapsulant regions. Persons of skill in the art are familiar with, and have easy access to, a wide variety of materials which are suitable for use in making an encapsulant region for a light emitting device (e.g., LEDs), and any such materials can, if desired, be employed. For example, two well-known representative classes of materials out of which the encapsulant region can be constructed include epoxies and silicones. In addition, any suitable liquid, gas, gel or solid (or combination such as air-gel) which is substantially transparent can be used.

Persons of skill in the art are also familiar with a wide variety of suitable shapes for the encapsulant region, and the encapsulant region(s) (if employed) in the devices according to the present invention can be of any such shape. Persons of skill in the art are also familiar with various ways to make a packaged device incorporating the various elements described herein in connection with the present invention. Accordingly, further description of materials for use in making the encapsulant region, shapes for the encapsulant region and methods of making the devices described herein is not needed.

The, or each of the, one or more encapsulant regions can, independently, be positioned in any desired location, and can be held in place in any desired way, a wide variety of which will be readily apparent to persons of skill in the art, who will be readily able to position such encapsulant region(s) in any such manner. The encapsulant regions can, if desired, be formed around other components of the device (e.g., the active layer structure, the first element, the second element, and the one or more lumiphor, if provided) in any of a variety of ways well-known to those skilled in the art. The encapsulant can also be positioned within an enclosure, such as a glass or plastic bubble.

The structures according to the present invention, as described herein, make it possible to minimize, reduce or eliminate the backscattering of light from the LED by structures within the device, e.g., the light converting layer (such as a lumiphor).

As noted above, the methods according to the present invention can, if desired, comprise one or more of the following:

attaching a first element to at least one light emitting active layer structure;

depositing a light emitting active layer structure on a second element;

depositing a light emitting active layer structure on a reflective element;

depositing a second element on at least one reflective element;

removing a second element;

positioning at least one lumiphor;

forming (or positioning) at least one encapsulant region;

depositing at least one reflective element on a second element;

depositing a reflective material onto an active layer structure; and attaching a third element to an active layer structure first side.

In general, it is desirable to perform the operations which must be performed at a higher temperature before all operations which can be performed at a lower temperature.

In many cases, it is desirable to construct wafers having the respective desired structures as described above, e.g., comprising an active layer structure, a first element, a second element (if included), a third element (if included), and one or more reflective elements (if included), and then to dice the wafers into individual die elements (after which one or more lumiphors (if included) and/or one or more encapsulant regions (if included) can be associated with the individual die elements). Persons of skill in the art are familiar with many different methods of dicing, and can readily apply the present invention to the construction of wafers and subsequent dicing. In general, it is preferred to introduce as many of the structures (to be included in the final dice) as possible before performing the dicing operation.

As noted above, according to some embodiments of the present invention, the first element is attached to at least one light emitting active layer structure. As used herein, the expression "attached", e.g., where a first structure is (or is being) attached to a second structure, means that something which includes (or consists of) the first structure is attached to something which includes (or consists of) the second structure (or that something which includes or consists of the first structure is being attached to something which includes or consists of the second structure. That is, if element one is attached to element two, there might be additional structures (e.g., one or more adhesive layer) positioned between element one and element two (likewise, if element one is being attached to element two, there might be additional structures, e.g., one or more adhesive layer, positioned between element one and element two after element one becomes attached to element two). As used herein, the expression "attached", e.g., where a first structure is being attached to a second structure, encompasses bonding the first structure to the second structure (e.g., by applying an adhesive to the second layer and then bringing the first layer into contact with the adhesive) or bonding the second structure to the first structure (or, where a first structure is attached to a second structure, the first structure bonded to the second structure, e.g., with an adhesive between the second layer and the first layer). As used herein, a statement that a first structure is being attached to a second structure is interchangeable with a statement that the second structure is being attached to the first structure (i.e., the order in which the structures are recited in such a statement does not imply anything other than that the structures end up being attached at the end of the procedure). Further, as used herein, the expressions "attaching" and "attached" encompass depositing one structure upon another ("depositing" is discussed in more detail below), e.g., a statement that a first structure is being attached to a second structure encompasses depositing the first structure on the second structure or depositing the second structure on the first structure. In addition, as used herein, the expressions "positioning" and "positioned" encompass depositing one structure upon another ("depositing" is discussed in more detail below), e.g., the expression "positioning" a structure encompasses depositing the structure. A statement that a first structure is directly attached to a second structure (which falls within the scope of attaching a first structure to a second structure) means that after the attaching is completed, the first structure and second structure are attached to each other and are in direct contact with each other.

The first element can be attached to the at least one light emitting active layer structure in any suitable way, a variety of which are familiar to, and can readily be carried out by, those of skill in the art. For example, the first element can be attached using van der Waals bonding, covalent bonding, electrostatic bonding (e.g., using heat, pressure and/or electric charge), applying glue, etc. Additionally, the first element can be deposited onto the at least one light emitting active layer structure in any suitable way, a variety of which are familiar to, and can readily be carried out by, those of skill in the art. For example, the first element can be deposited using pulsed laser deposition PLD.

As described above, various structures can be deposited. As used herein, the expression "deposited", e.g., where a first structure is being deposited on a second structure, means that something which includes (or consists of) the first structure is being directly deposited on something which includes (or consists of) the second structure. That is, if element one is being deposited on element two, there might be additional structures positioned between element one and element two after element one becomes deposited on element two. A statement that a first structure is directly deposited on a second structure (which falls within the scope of depositing a first structure on a second structure) means that after the depositing is completed, the first structure and second structure are in direct contact with each other.

Persons of skill in the art are very familiar with a variety of processes for depositing one material onto another, particularly in the context of constructing a solid state light emitting device, and skilled artisans would readily be able to perform such depositing procedures.

A second element can be removed in any suitable way, a wide variety of which are familiar to persons of skill in the art. For example, any of a wide variety of etching procedures can be employed.

The devices of the present invention can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present invention. The lighting devices of the present invention can be electrically connected (or selectively connected) to any desired power source, persons of skill in the art being familiar with a variety of such power sources.

Representative examples of arrangements of lighting devices, schemes for mounting lighting devices, apparatus for supplying electricity to lighting devices, housings for lighting devices, fixtures for lighting devices and power supplies for lighting devices, all of which are suitable for the lighting devices of the present invention, are described (1) in U.S. Patent Application No. 60/752,753, filed on Dec. 21, 2005, entitled "Lighting Device" (inventors: Gerald H. Negley, Antony Paul Van de Ven and Neal Hunter), the entirety of which is hereby incorporated by reference, (2) in U.S. Patent Application No. 60/798,446, filed on May 5, 2006, entitled "Lighting Device" (inventor: Antony Paul Van de Ven), the entirety of which is hereby incorporated by reference, and (3) in U.S. Patent Application No. 60/802,697, filed on May 23, 2006, entitled "Lighting Device and Method of Making" (inventor: Gerald H. Negley), the entirety of which is hereby incorporated by reference.

In some embodiments according to the present invention, one or more of the light emitting diodes can be included in a package together with one or more of the lumiphors, and the one or more lumiphor in the package can be spaced from the one or more light emitting diode in the package to achieve improved light extraction efficiency, as described in U.S. Patent Application No. 60/753,138, filed on Dec. 22, 2005, entitled "Lighting Device" (inventor: Gerald H. Negley), the entirety of which is hereby incorporated by reference.

In some embodiments according to the present invention, two or more lumiphors can be provided, two or more of the lumiphors being spaced from each other, as described in U.S. Patent Application No. 60/761,310, filed on Jan. 23, 2006, entitled "Shifting Spectral Content in LEDs by Spatially Separating Lumiphor Films" (inventors: Gerald H. Negley and Antony Paul Van de Ven), the entirety of which is hereby incorporated by reference.

FIG. 1 is a schematic cross-sectional illustration of a first embodiment according to the present invention. Referring to FIG. 1, there is shown a light emitter 10 including a first element 11, a light emitting active layer structure 12, a second element 13, a contact 14 and a metallized contact 15. The first element 11, the light emitting active layer structure 12, and the second element 13 are each generally rectilinear, i.e., a top view of any of them would show a generally rectangular perimeter.

In this embodiment, the first element is in direct contact with the light emitting active layer structure.

In this embodiment, the light emitting active layer structure has an active layer structure first side 16 and an active layer structure second side 17. The first element 11 is positioned on (and in direct contact with) the active layer structure first side 16, and the active layer second side 17 is positioned on (and in direct contact with) the second element 13. Also are included electrically conductive contacts 14 and 15.

Figure 2:
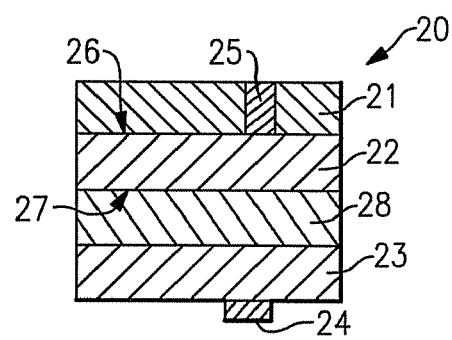
FIG. 2 is a schematic cross-sectional illustration of a second embodiment according to the present invention.

FIG. 2 is a schematic cross-sectional illustration of a second embodiment according to the present invention. Referring to FIG. 2, there is shown a light emitter 20 including a first element 21, a light emitting active layer structure 22, a reflective element 28, a second element 23, an electrically conductive contact 24 and an electrically conductive contact 25.

In this embodiment, the first element is in direct contact with the light emitting active layer structure.

In this embodiment, the light emitting active layer structure has an active layer structure first side 26 and an active layer structure second side 27. To illustrate the terminology described above, the first element 21 is positioned on (and in direct contact with) the active layer structure first side 26 (and vice-versa), the active layer second side 27 is positioned on (but not in direct contact with) the second element 23 (and vice-versa), the reflective layer 28 is positioned on (and in direct contact with) the second element 23 (and vice-versa), and the light emitting active layer structure 22 is positioned on (and in direct contact with) the reflective layer 28 (and vice-versa, i.e., the reflective layer 28 is positioned on and in direct contact with the light emitting active layer structure 22).

Figure 3:
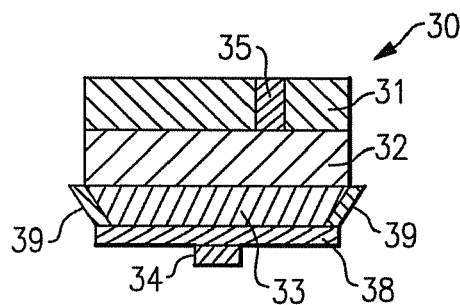
FIG. 3 is a schematic cross-sectional illustration of a third embodiment according to the present invention.

FIG. 3 is a schematic cross-sectional illustration of a third embodiment according to the present invention. Referring to FIG. 3, there is shown a light emitter 30 including a first element 31, a light emitting active layer structure 32, a second element 33, a first reflective layer 38, a second reflective layer 39, an electrically conductive contact 34 and an electrically conductive contact 35. The second reflective layer 39 goes around the entire circumference of the second element 33. The angle of the beveled second reflective layer 39, relative to a vertical (in the orientation shown in FIG. 3) line is preferably not larger than 45 degrees. In this embodiment, one method of providing the beveled mirrors is to perform partial cuts in the wafer to provide beveled grooves, then metallize the grooves, and then complete the cutting (i.e., to divide the wafer into a plurality of dice).

Figure 4:
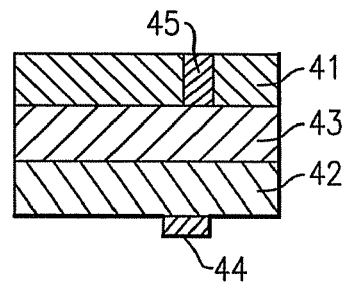
FIG. 4 is a schematic cross-sectional illustration of a fourth embodiment according to the present invention.

FIG. 4 is a schematic cross-sectional illustration of a fourth embodiment according to the present invention. Referring to FIG. 4, there is shown a light emitter 40 including a first element 41, a light emitting active layer structure 42, a second element 43, an electrically conductive contact 44 and an electrically conductive contact 45. This embodiment can optionally further include a reflective element positioned on the active layer structure 42 opposite the second element 43, and/or one or more beveled reflective elements analogous to as shown in FIG. 3.

Figure 5:
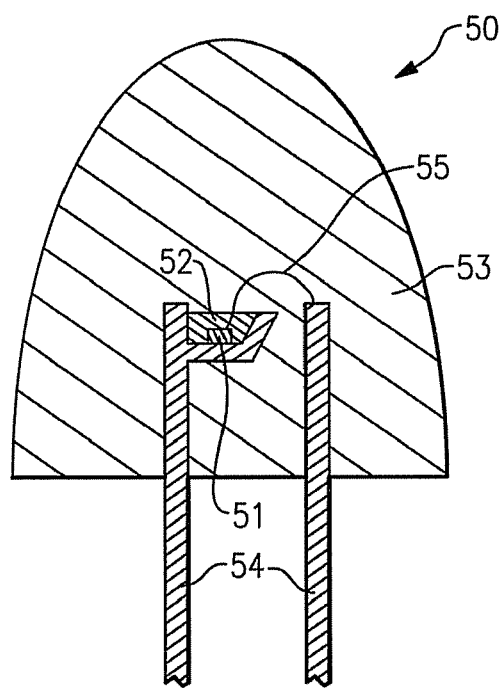
FIG. 5 is a schematic cross-sectional view of a fifth embodiment according to the present invention.

FIG. 5 is a schematic cross-sectional view of a fifth embodiment according to the present invention. FIG. 5 depicts a packaged LED 50 which includes a light emitting diode chip 51 (e.g., according to one of the first, second, third and fourth embodiments described above, with the first element above the active layer structure in the orientation depicted), a lumiphor 52, an encapsulant region 53, a lead frame 54 and a wire 55.

Figure 6:
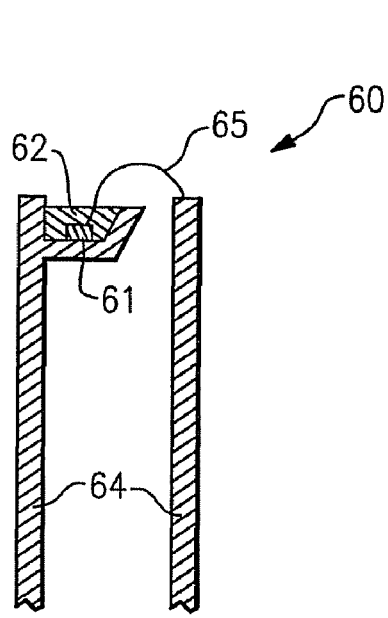
FIG. 6 is a schematic cross-sectional view of a sixth embodiment according to the present invention.

FIG. 6 is a schematic cross-sectional view of a sixth embodiment according to the present invention. FIG. 6 depicts a packaged LED 60 which includes a light emitting diode chip 61 (e.g., according to one of the first, second, third and fourth embodiments described above, with the first element above the active layer structure in the orientation depicted), a lumiphor 62, a lead frame 64 and a wire 65.

Figure 7:
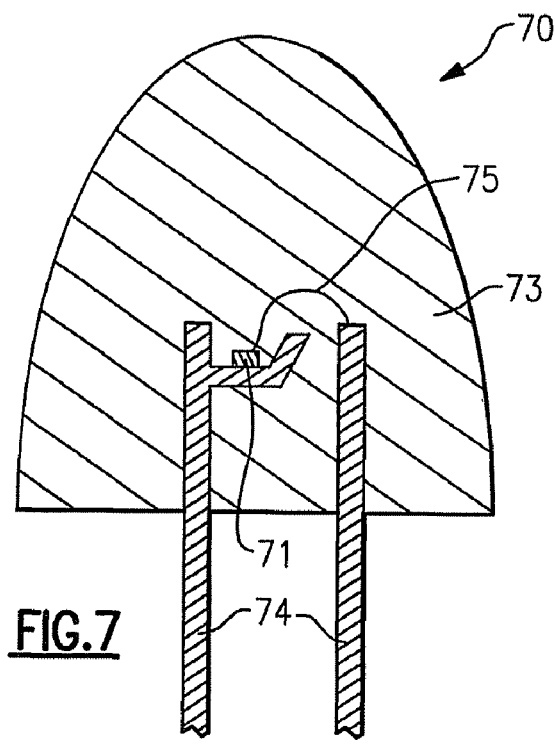
FIG. 7 is a schematic cross-sectional view of a seventh embodiment according to the present invention.

FIG. 7 is a schematic cross-sectional view of a seventh embodiment according to the present invention. FIG. 7 depicts a packaged LED 70 which includes a light emitting diode chip 71 (e.g., according to one of the first, second, third and fourth embodiments described above, with the first element above the active layer structure in the orientation depicted), an encapsulant region 73, a lead frame 74 and a wire 75.

Figure 8:
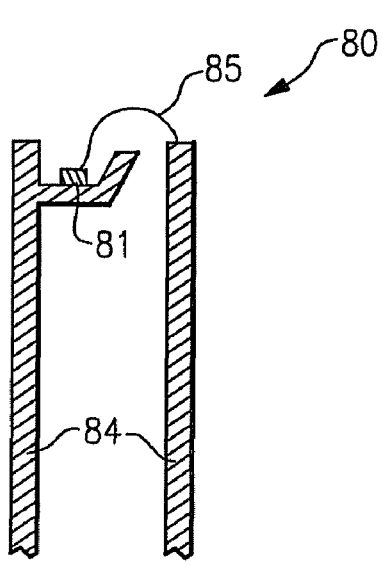
FIG. 8 is a schematic cross-sectional view of an eighth embodiment according to the present invention.

FIG. 8 is a schematic cross-sectional view of an eighth embodiment according to the present invention. FIG. 8 depicts a packaged LED 80 which includes a light emitting diode chip 81 (e.g., according to one of the first, second, third and fourth embodiments described above, with the first element above the active layer structure in the orientation depicted), a lead frame 84 and a wire 85. In this embodiment, the side of the first element which faces away from the active layer structure is exposed, i.e., it is in contact with a space which comprises air.

Figure 9:
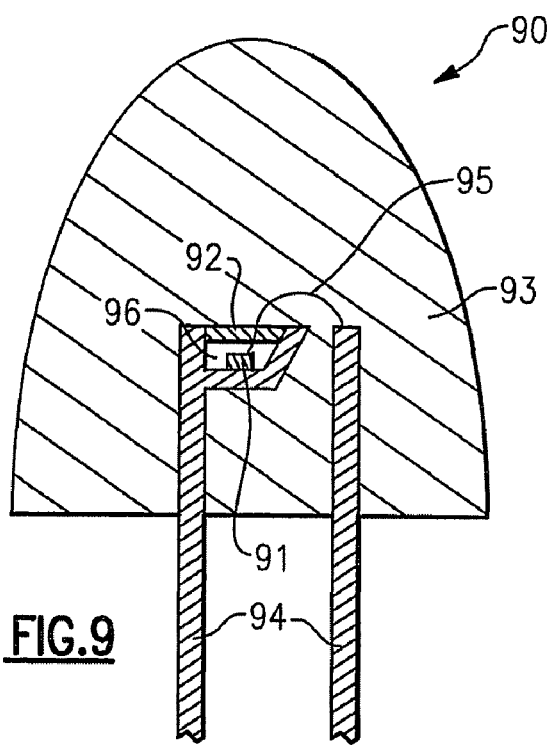
FIG. 9 is a schematic cross-sectional view of a ninth embodiment according to the present invention.

FIG. 9 is a schematic cross-sectional view of a ninth embodiment according to the present invention. FIG. 9 depicts a packaged LED 90 which includes a light emitting diode chip 91 (e.g., according to one of the first, second, third and fourth embodiments described above, with the first element above the active layer structure in the orientation depicted), a lumiphor 92, an encapsulant region 93, a lead frame 94 and a wire 95. The embodiment shown in FIG. 9 is similar to the embodiment shown in FIG. 5, except that in the embodiment shown in FIG. 9, the lumiphor 92 is spaced from the first element of the light emitting diode chip 91, and a space 96 between the lumiphor 92 and the light emitting diode chip 91 comprises air.

Persons of skill in the art are familiar with, and are able to practice, a variety of methods for making packaged LEDs, and any such methods can be employed to make packaged LEDs according to the present invention. For example, representative examples of ways to manufacture LEDs are disclosed in U.S. Patent Application No. 60/802,697, filed on May 23, 2006, entitled "Lighting Device and Method of Making" (inventor: Gerald H. Negley), the entirety of which is hereby incorporated by reference.

Figure 10:
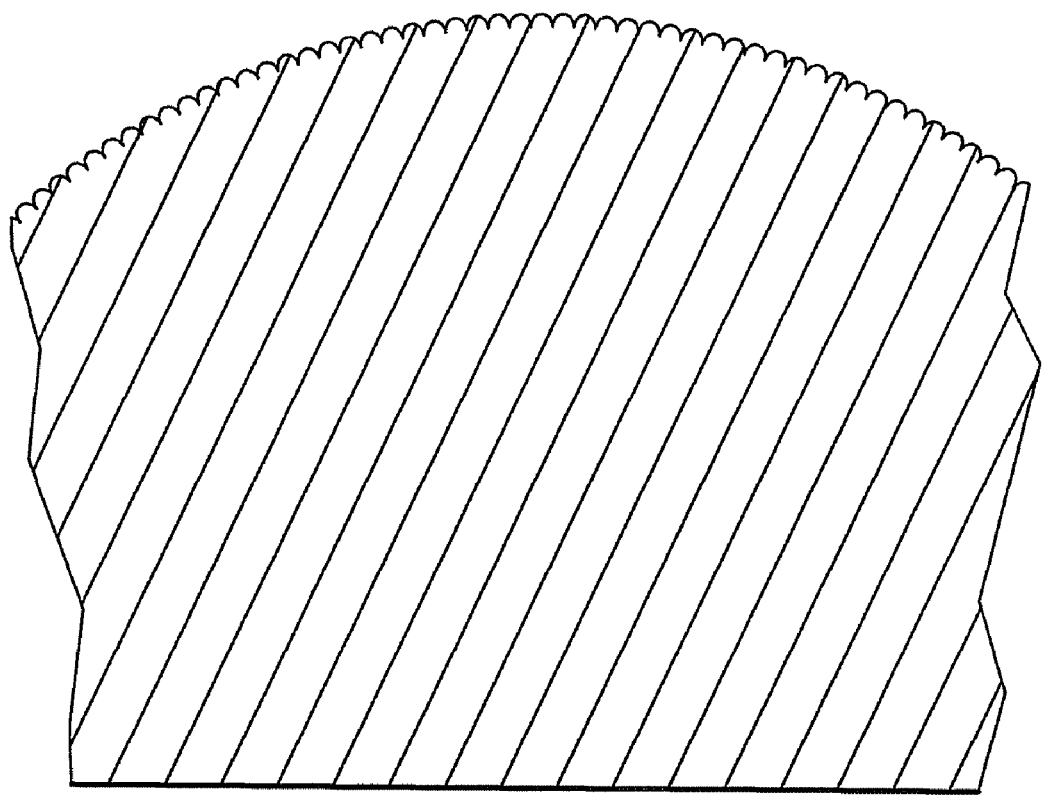
FIG. 10 is a schematic representation of a surface of a first element which include optical features (not drawn to scale).

FIG. 10 is a schematic representation of a surface of a first element which include optical features (not drawn to scale). FIG. 10 schematically shows overall curvature of the surface of the first element, as well as micro- or nano-undulations of a moth's eye structure.

Any two or more structural parts of the devices described herein can be integrated. Any structural part of the lighting devices described herein can be provided in two or more parts (which are held together, if necessary). Similarly, any two or more functions can be conducted simultaneously, and/or any function can be conducted in a series of steps.

The invention claimed is:
1. A solid state light emitting device comprising:
   a first element, at least a first region of said first element having an index of refraction gradient;
   at least one light emitting active layer structure, said first element on said light emitting active layer structure; and at least one second structure selected from (1) at least one lumiphor and (2) at least one encapsulant region, said first element between said second structure and said light emitting active layer structure, so that at least some light emitted from the light emitting active layer passes through the first element and then through the second structure, a first surface of said light emitting active layer structure facing said first element and in direct contact with said first element, a first region of said light emitting active layer structure comprising at least a portion of said first surface of said light emitting active layer structure, said first region of said light emitting active layer structure having an active layer first region index of refraction, a second surface of said second structure facing said first element, a second region of said second structure comprising at least a portion of said second surface of said second structure, said second region of said second structure having a second structure second region index of refraction, said index of refraction gradient ranging from said active layer first region index of refraction to said second structure second region index of refraction.

2. A device as recited in claim 1, further comprising at least a first intervening structure between said first element and said light emitting active layer structure.

3. A device as recited in claim 2, wherein said first intervening structure has an index of refraction which is similar to an index of refraction of at least a portion of said first element.

4. A device as recited in claim 2, wherein said first intervening structure has an index of refraction which is similar to an index of refraction of at least a portion of said light emitting active layer structure.

5. A device as recited in claim 2, wherein said first intervening structure comprises glue.

6. A device as recited in claim 1, wherein said index of refraction gradient of said first element comprises a stepped index of refraction gradient.

7. A device as recited in claim 1, wherein said index of refraction gradient of said first element comprises a substantially continuous index of refraction gradient.

8. A device as recited in claim 1, wherein a surface of said first element which is opposite to said light emitting active layer structure comprises at least one optical feature.

9. A device as recited in claim 1, wherein said lumiphor is on said first element.

10. A device as recited in claim 9, wherein said lumiphor is in direct contact with said first element.

11. A device as recited in claim 1, wherein said lumiphor is spaced from said first element, at least a portion of a space between said lumiphor and said first element comprising a gas.

12. A device as recited in claim 11, wherein said gas comprises air.

13. A device as recited in claim 1, wherein said encapsulant region is on said first element.

14. A device as recited in claim 13, wherein said encapsulant region is in direct contact with said first element.

15. A device as recited in claim 13, further comprising at least one lumiphor, at least a portion of said lumiphor between said first element and said encapsulant region, whereby if light is emitted from said light emitting active layer structure and passes through said first element, said lumiphor and said encapsulant region, such light would pass through said first element before passing through said lumiphor and would pass through said lumiphor before passing through said encapsulant region.

16. A device as recited in claim 15, wherein said lumiphor is on said first element.

17. A device as recited in claim 16, wherein said lumiphor is in direct contact with said first element.

18. A device as recited in claim 15, wherein said lumiphor is spaced from said first element, at least a portion of a space between said lumiphor and said first element comprising a gas.

19. A device as recited in claim 18, wherein said gas comprises air.

20. A device as recited in claim 1, wherein said encapsulant region is spaced from said first element, at least a portion of a space between said encapsulant region and said first element comprising a gas.

21. A device as recited in claim 20, wherein said gas comprises air.

22. A device as recited in claim 1, further comprising a second element, said light emitting active layer structure having an active layer structure first side and an active layer structure second side, said first element on said active layer first side, said active layer second side on said second element.

23. A device as recited in claim 22, wherein said light emitting active layer structure is in direct contact with said second element and said first element is in direct contact with said light emitting active layer structure.

24. A device as recited in claim 22, further comprising at least one reflective element between said second element and said light emitting active layer structure.

25. A device as recited in claim 24, wherein said reflective element is in direct contact with said second element, said light emitting active layer structure is in direct contact with said reflective element, and said first element is in direct contact with said light emitting active layer structure.

26. A device as recited in claim 22, further comprising at least one reflective element, said second element having a second element first side and a second element second side, said light emitting active layer on said second element first side, said reflective element on said second element second side.

27. A device as recited in claim 26, further comprising at least one bevel reflective element, said bevel reflective element on a second element third side, said second element third side extending between said second element first side and said second element second side.

28. A device as recited in claim 26, wherein said second element second side is in direct contact with said reflective element, said light emitting active layer structure is in direct contact with said second element first side, and said first element is in direct contact with said light emitting active layer structure.

29. A device as recited in claim 1, further comprising a second element, wherein said second element is on said light emitting active layer structure, and said first element is on said second element.

30. A device as recited in claim 29, wherein said second element is in direct contact with said light emitting active layer structure, and said first element is in direct contact with said second element.

31. A solid state light emitting device as recited in claim 1, wherein the light emitting device further comprises at least a first reflective element, at least a portion of the light emitting active layer structure between the first reflective element and the first element.

32. A solid state light emitting device comprising:
at least one light emitting active layer structure, said light emitting active layer structure having an active layer structure first surface and an active layer structure second surface, a first region of said light emitting active layer structure which includes at least a portion of said active layer structure first surface having an active layer first region index of refraction;

a first element on said active layer structure first surface; and at least one second structure selected from (1) at least one lumiphor and (2) at least one encapsulant region, said first element between said second structure and said light emitting active layer structure, so that at least some light emitted from the light emitting active layer passes through the first element and then through the second structure, said first surface of said light emitting active layer structure facing said first element, a second surface of said second structure facing said first element, a second region of said second structure comprising at least a portion of said second surface of said second structure, said second region of said second structure having a second structure second region index of refraction, an entirety of said first element having a first element index of refraction that is of a single value between said active layer first region index of refraction and said second structure second region index of refraction.

33. A device as recited in claim 32, wherein a surface of said first element which is opposite to said light emitting active layer structure comprises at least one optical feature.

34. A device as recited in claim 32, wherein said lumiphor is on said first element.

35. A device as recited in claim 34, wherein said lumiphor is in direct contact with said first element.

36. A device as recited in claim 32, wherein said lumiphor is spaced from said first element, at least a portion of a space between said lumiphor and said first element comprising a gas.

37. A device as recited in claim 36, wherein said gas comprises air.

38. A device as recited in claim 32, wherein said first element index of refraction is a geometric mean of said active layer first region index of refraction and said second structure second region index of refraction.

39. A device as recited in claim 32, further comprising a second element, said first element on said active layer first surface, said active layer second surface on said second element.

40. A device as recited in claim 39, further comprising at least one reflective element positioned between said second element and said light emitting active layer structure.

41. A device as recited in claim 39, further comprising at least one reflective element, said second element having a second element first side and a second element second side, said light emitting active layer on said second element first side, said reflective element on said second element second side.

42. A device as recited in claim 41, further comprising at least one bevel reflective element, said bevel reflective element on a second element third side, said second element third side extending between said second element first side and said second element second side.

43. A device as recited in claim 42, wherein said second element second side is in direct contact with said reflective element, said light emitting active layer structure is in direct contact with said second element first side, and said first element is in direct contact with said light emitting active layer structure.

44. A device as recited in claim 32, further comprising a second element, wherein said second element is positioned on said light emitting active layer structure, and said first element is positioned on said second element.

45. A solid state light emitting device as recited in claim 32, wherein the light emitting device further comprises at least a first reflective element, at least a portion of the light emitting active layer structure between the first reflective element and the first element.

46. A solid state light emitting device comprising:

at least one light emitting active layer structure, said light emitting active layer structure having an active layer structure first surface and an active layer structure second surface;

a first element on said active layer structure first surface, at least a portion of said first element having a stepped index of refraction.

47. A device as recited in claim 46, wherein a surface of said first element which is opposite to said light emitting active layer structure comprises at least one optical feature.

48. A device as recited in claim 46, wherein said device further comprises at least one second structure selected from (1) at least one lumiphor and (2) at least one encapsulant region, said second structure opposite said first element relative to said light emitting active layer structure, so that at least some light emitted from the light emitting active layer passes through the first element and then through the second structure.

49. A device as recited in claim 48, wherein said encapsulant region is on said first element.

50. A device as recited in claim 49, wherein said encapsulant region is in direct contact with said first element.

51. A device as recited in claim 48, wherein said encapsulant region is spaced from said first element, at least a portion of a space between said encapsulant region and said first element comprising a gas.

52. A device as recited in claim 51, wherein said gas comprises air.

53. A device as recited in claim 48, wherein said lumiphor is positioned on said first element.

54. A device as recited in claim 53, wherein said lumiphor is in direct contact with said first element.

55. A device as recited in claim 48, wherein said lumiphor is spaced from said first element, at least a portion of a space between said lumiphor and said first element comprising a gas.

56. A device as recited in claim 55, wherein said gas comprises air.

57. A device as recited in claim 46, wherein said device further comprises a space opposite said first element relative to said light emitting active layer structure, so that at least some light emitted from the light emitting active layer passes through the first element and then through the space.

58. A device as recited in claim 46, wherein a first surface of said first element is exposed to an exterior of said solid state lighting device.

59. A device as recited in claim 58, wherein an entirety of said first surface of said first element is exposed to an exterior of said solid state lighting device.

60. A solid state light emitting device as recited in claim 46, wherein the light emitting device further comprises at least a first reflective element, at least a portion of the light emitting active layer structure between the first reflective element and the first element.

61. A solid state light emitting device comprising:

at least one light emitting active layer structure, said light emitting active layer structure having an active layer structure first surface and an active layer structure second surface, a first region of said light emitting active layer structure which includes at least a portion of said active layer structure first surface having an active layer first region index of refraction;
a first element having a first element first surface and a first element second surface, said first element second surface on said active layer structure first surface, said first element first surface exposed to an exterior of said solid state lighting device, at least a first region of said first element having an index of refraction gradient, said index of refraction gradient ranging from a lower value to an upper value, said upper value not greater than said active layer first region index of refraction, said lower value lower than said upper value, but greater than 1.0.

62. A device as recited in claim 61, wherein said first element first side comprises at least one optical feature.

63. A device as recited in claim 61, further comprising a second element, said first element on said active layer first surface, said active layer second surface on said second element.

64. A device as recited in claim 63, further comprising at least one reflective element between said second element and said light emitting active layer structure.

65. A device as recited in claim 63, further comprising at least one reflective element, said second element having a second element first side and a second element second side, said light emitting active layer on said second element first side, said reflective element on said second element second side.

66. A device as recited in claim 65, further comprising at least one bevel reflective element, said bevel reflective element on a second element third side, said second element third side extending between said second element first side and said second element second side.

67. A device as recited in claim 66, wherein said second element second side is in direct contact with said reflective element, said light emitting active layer structure is in direct contact with said second element first side, and said first element is in direct contact with said light emitting active layer structure.

68. A device as recited in claim 61, further comprising a second element, wherein said second element is positioned on said light emitting active layer structure, and said first element is positioned on said second element.

69. A solid state light emitting device as recited in claim 61, wherein the light emitting device further comprises at least a first reflective element, at least a portion of the light emitting active layer structure between the first reflective element and the first element.

70. A solid state light emitting device comprising:
a first element;
at least one light emitting active layer structure, said first element on said light emitting active layer structure; and
at least one second structure selected from (1) at least one lumiphor and (2) at least one encapsulant region,
said first element between said active layer structure and said second structure,
a second surface of said second structure facing said first element, a first region of said second structure comprising at least a portion of said second surface of said second structure, said first region of said second structure having a second structure first region index of refraction,
a first surface of said light emitting active layer structure facing said first element, a first region of said light emitting active layer structure comprising at least a portion of said first surface of said light emitting active layer structure, said first region of said light emitting active layer structure having an active layer first region index of refraction,
at least a first region of said first element having an index of refraction gradient, said index of refraction gradient ranging from a lower value to an upper value, said upper value not greater than said active layer first region index of refraction, said lower value lower than said upper value, but greater than said second structure first region index of refraction.

71. A device as recited in claim 70, further comprising a second element, said first element on said active layer first surface, said active layer second surface on said second element.

72. A device as recited in claim 71, further comprising at least one reflective element positioned between said second element and said light emitting active layer structure.

73. A device as recited in claim 71, further comprising at least one reflective element, said second element having a second element first side and a second element second side, said light emitting active layer on said second element first side, said reflective element on said second element second side.

74. A device as recited in claim 73, further comprising at least one bevel reflective element, said bevel reflective element on a second element third side, said second element third side extending between said second element first side and said second element second side.

75. A device as recited in claim 74, wherein said second element second side is in direct contact with said reflective element, said light emitting active layer structure is in direct contact with said second element first side, and said first element is in direct contact with said light emitting active layer structure.

76. A device as recited in claim 70, further comprising a second element, wherein said second element is positioned on said light emitting active layer structure, and said first element is positioned on said second element.

77. A solid state light emitting device as recited in claim 70, wherein the light emitting device further comprises at least a first reflective element, at least a portion of the light emitting active layer structure between the first reflective element and the first element.

78. A solid state light emitting device comprising:
at least one light emitting active layer structure, said light emitting active layer structure having an active layer structure first surface and an active layer structure second surface, a first region of said light emitting active layer structure which includes at least a portion of said active layer structure first surface having an active layer first region index of refraction; and
a first element on said active layer structure first surface;
said first surface of said light emitting active layer structure facing said first element,
said first element having a first element first surface and a first element second surface, said first element second surface on said active layer structure first surface, said first element first surface exposed to an exterior of said solid state lighting device,
at least a portion of said first element having an index of refraction gradient that ranges from at least 1.0 to a value that is less than said active layer first region index of refraction.

79. A device as recited in claim 78, further comprising a second element, said first element on said active layer first surface, said active layer second surface on said second element.

80. A device as recited in claim 79, further comprising at least one reflective element positioned between said second element and said light emitting active layer structure.

81. A device as recited in claim 79, further comprising at least one reflective element, said second element having a second element first side and a second element second side, said light emitting active layer on said second element first side, said reflective element on said second element second side.

82. A device as recited in claim 81, further comprising at least one bevel reflective element, said bevel reflective element on a second element third side, said second element third side extending between said second element first side and said second element second side.

83. A device as recited in claim 82, wherein said second element second side is in direct contact with said reflective element, said light emitting active layer structure is in direct contact with said second element first side, and said first element is in direct contact with said light emitting active layer structure.

84. A device as recited in claim 78, further comprising a second element, wherein said second element is positioned on said light emitting active layer structure, and said first element is positioned on said second element.

85. A solid state light emitting device as recited in claim 78, wherein the light emitting device further comprises at least a first reflective element, at least a portion of the light emitting active layer structure between the first reflective element and the first element.

86. A solid state light emitting device comprising:
at least one light emitting active layer structure, said light emitting active layer structure having an active layer structure first surface and an active layer structure second surface, a first region of said light emitting active layer structure which includes at least a portion of said active layer structure first surface having an active layer first region index of refraction;
a first element on said active layer structure first surface; and
at least one second structure selected from (1) at least one lumiphor and (2) at least one encapsulant region,
said first element between said active layer structure and said second structure,
a second surface of said second structure facing said first element, a first region of said second structure comprising at least a portion of said second surface of said second structure, said first region of said second structure having a second structure first region index of refraction,
at least a first region of said first element having an index of refraction gradient, said index of refraction gradient ranging from a value that is less than said active layer first region index of refraction to a value that is at least said second structure first region index of refraction.

87. A device as recited in claim 86, further comprising a second element, said first element on said active layer first surface, said active layer second surface on said second element.

88. A device as recited in claim 87, further comprising at least one reflective element positioned between said second element and said light emitting active layer structure.

89. A device as recited in claim 88, further comprising at least one reflective element, said second element having a second element first side and a second element second side, said light emitting active layer on said second element first side, said reflective element on said second element second side.

90. A device as recited in claim 89, further comprising at least one bevel reflective element, said bevel reflective element on a second element third side, said second element third side extending between said second element first side and said second element second side.

91. A device as recited in claim 90, wherein said second element second side is in direct contact with said reflective element, said light emitting active layer structure is in direct contact with said second element first side, and said first element is in direct contact with said light emitting active layer structure.

92. A device as recited in claim 86, further comprising a second element, wherein said second element is positioned on said light emitting active layer structure, and said first element is positioned on said second element.

93. A solid state light emitting device as recited in claim 86, wherein the light emitting device further comprises at least a first reflective element, at least a portion of the light emitting active layer structure between the first reflective element and the first element.

* * * * *

UNITED STATES PATENT AND TRADEMARK OFFICE
CERTIFICATE OF CORRECTION

| | | |
|---|---|---|
| PATENT NO. | : 8,008,676 B2 | Page 1 of 1 |
| APPLICATION NO. | : 11/753103 | |
| DATED | : August 30, 2011 | |
| INVENTOR(S) | : Gerald H. Negley et al. | |

It is certified that error appears in the above-identified patent and that said Letters Patent is hereby corrected as shown below:

<u>Column 24</u>

*Line 40*: please delete "positioned" after "is"

Signed and Sealed this
Sixth Day of December, 2011

David J. Kappos
*Director of the United States Patent and Trademark Office*